(12) United States Patent
Yu et al.

(10) Patent No.: US 9,040,381 B2
(45) Date of Patent: May 26, 2015

(54) PACKAGES WITH PASSIVE DEVICES AND METHODS OF FORMING THE SAME

(71) Applicant: Taiwan Semiconductor Manufacturing Company, Ltd., Hsin-Chu (TW)

(72) Inventors: Chen-Hua Yu, Hsin-Chu (TW);
Shang-Yun Hou, Jubei (TW);
Der-Chyang Yeh, Hsin-Chu (TW);
Shuo-Mao Chen, New Taipei (TW);
Chiung-Han Yeh, Tainan (TW); Yi-Jou Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/080,014

(22) Filed: Nov. 14, 2013

(65) Prior Publication Data
US 2014/0073091 A1  Mar. 13, 2014

Related U.S. Application Data

(62) Division of application No. 13/464,081, filed on May 4, 2012, now Pat. No. 8,680,647.

(60) Provisional application No. 61/581,279, filed on Dec. 29, 2011.

(51) Int. Cl.
*H01L 21/20* (2006.01)
*H01L 21/56* (2006.01)
*H01L 23/64* (2006.01)
(Continued)

(52) U.S. Cl.
CPC ............... *H01L 21/56* (2013.01); *H01L 23/64* (2013.01); *H01L 27/016* (2013.01); *H01L 28/00* (2013.01); *H01L 23/3192* (2013.01); *H01L 23/49816* (2013.01); *H01L 23/49822* (2013.01); *H01L 23/49894* (2013.01); *H01L 23/5389* (2013.01); *H01L 24/19* (2013.01); *H01L 2224/0401* (2013.01); *H01L 2224/04105* (2013.01); *H01L 2224/12105* (2013.01); *H01L 2224/16225* (2013.01); *H01L 2224/32225* (2013.01); *H01L 2224/73204* (2013.01); *H01L 2224/92125* (2013.01); *H01L 2924/18162* (2013.01); *H01L 2924/19011* (2013.01); *H01L 2924/1903* (2013.01); *H01L 2924/19033* (2013.01); *H01L 2924/19041* (2013.01); *H01L 2924/19042* (2013.01); *H01L 2924/19043* (2013.01); *H01L 2924/19104* (2013.01); *H01L 2924/19031* (2013.01)

(58) Field of Classification Search
USPC .......... 438/113, 124, 381; 257/528, 531, 532, 257/533, 536
See application file for complete search history.

(56) References Cited

U.S. PATENT DOCUMENTS

| | | |
|---|---|---|
| 5,874,770 A | 2/1999 | Saia et al. |
| 6,410,960 B1 | 6/2002 | Arai et al. |

(Continued)

*Primary Examiner* — Matthew W Such
*Assistant Examiner* — John M Parker
(74) *Attorney, Agent, or Firm* — Slater & Matsil, L.L.P

(57) ABSTRACT

A device includes a substrate, a metal pad over the substrate, and a passivation layer having a portion over the metal pad. A Post-Passivation Interconnect (PPI) line is disposed over the passivation layer and electrically coupled to the metal pad. An Under-Bump Metallurgy (UBM) is disposed over and electrically coupled to the PPI line. A passive device includes a portion at a same level as the UBM. The portion of the passive device is formed of a same material as the UBM.

20 Claims, 18 Drawing Sheets

(51) Int. Cl.
  *H01L 23/31* (2006.01)
  *H01L 23/498* (2006.01)
  *H01L 23/538* (2006.01)
  *H01L 23/00* (2006.01)
  H01L 27/01 (2006.01)
  H01L 49/02 (2006.01)

(56) References Cited

U.S. PATENT DOCUMENTS

| | | | |
|---|---|---|---|
| 6,534,374 B2 | 3/2003 | Johnson et al. | |
| 6,781,229 B1 * | 8/2004 | Fazelpour | 257/700 |
| 6,878,633 B2 | 4/2005 | Raskin et al. | |
| 7,466,388 B2 | 12/2008 | Fujisawa et al. | |
| 7,619,297 B2 | 11/2009 | Wang | |
| 7,858,441 B2 | 12/2010 | Lin et al. | |
| 8,084,859 B2 | 12/2011 | Tetani et al. | |
| 8,809,996 B2 | 8/2014 | Chen et al. | |
| 2002/0028533 A1 * | 3/2002 | Tang et al. | 438/106 |
| 2003/0045027 A1 * | 3/2003 | Johnson et al. | 438/108 |
| 2007/0267718 A1 | 11/2007 | Lee | |
| 2008/0153245 A1 | 6/2008 | Lin et al. | |
| 2009/0045512 A1 * | 2/2009 | Hedler et al. | 257/738 |
| 2009/0072388 A1 | 3/2009 | Tews et al. | |
| 2010/0237495 A1 | 9/2010 | Pagaila et al. | |
| 2011/0204509 A1 | 8/2011 | Lin et al. | |
| 2014/0295624 A1 | 10/2014 | Chen et al. | |

* cited by examiner

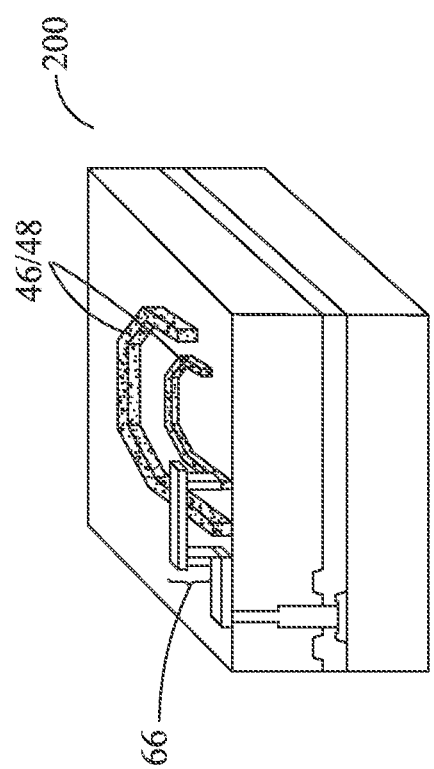

US 9,040,381 B2

PACKAGES WITH PASSIVE DEVICES AND METHODS OF FORMING THE SAME

This application is a divisional of U.S. patent application Ser. No. 13/464,081, entitled "Packages with Passive Devices and Methods of Forming the Same," filed on May 4, 2012, which application claims the benefit of the following provisionally filed U.S. Patent Application: application Ser. No. 61/581,279, filed Dec. 29, 2011, and entitled "FO-WLP Extra Cu-PPI Process and System Electrical Shielding Solution;" which applications are hereby incorporated herein by reference.

BACKGROUND

With the evolving of semiconductor technologies, semiconductor dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly with time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a high throughput and a low cost. Further, less underfill or molding compound is needed. This packaging technology, however, also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means that the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 15A through 19 illustrate some exemplary Integrated Passive Devices (IPD).

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package structure including Integrated Passive Devices (IPD) and the methods of forming the same are provided in accordance with an embodiment. The intermediate stages of manufacturing the package are illustrated. Variations of the embodiments are also discussed. Throughout the various views and illustrative embodiments, like reference numbers are used to designate like elements.

Figure 1:
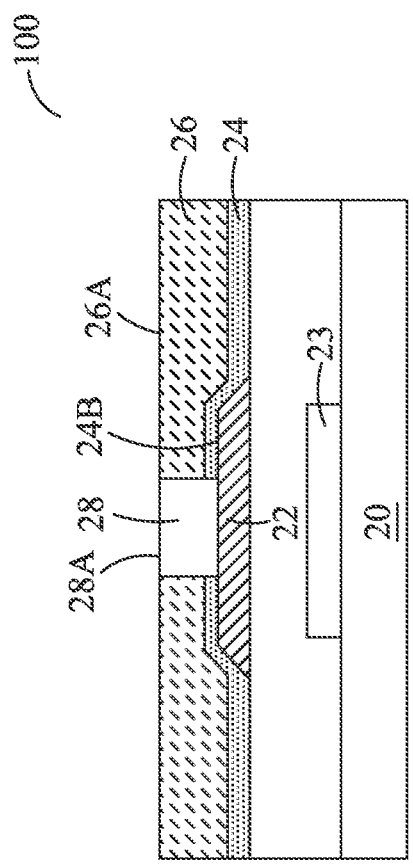
FIGS. 1 through 11 are cross-sectional views of intermediate stages in the manufacturing of a package in accordance with various exemplary embodiments.

Referring to FIG. 1, die 100 is provided. Die 100 includes substrate 20, which may be a semiconductor substrate. Die 100 may include integrated circuit devices 23 and overlying interconnect structures (not shown) formed therein. Integrated circuit devices 23 may include active devices such as transistors. Bond pad 22 is formed in die 100, and may be electrically coupled to integrated circuit devices 23 through the interconnect structures. Bond pad 22 may be formed of aluminum, copper, nickel, or combinations thereof. Passivation layers 24 and 26 are formed over bond pad 22. In some embodiments, a top surface of bond pad 22 is substantially level with a portion of bottom surface 24B of passivation layer 24. The materials of passivation layers 24 and 26 may be selected from solder resists, polyimide, polybenzoxazole (PBO), benzocyclobutene (BCB), JSR, molding compounds, and the like. Edges of passivation layers 24 and 26 may be vertically aligned to respective edges of substrate 20. Passivation layers 24 and 26 may be referred to as passivation-1 and passivation-2, respectively.

Metal pillar 28 is formed in passivation layer 24, and is electrically coupled to bond pad 22. In some embodiments, metal pillar 28 has a bottom surface contacting the top surface of bond pad 22. Metal pillar 28 may comprise copper, and hence is alternatively referred to as copper pillar 28 throughout the description. However, other conductive materials such as nickel and/or aluminum may also be used to form copper pillar 28. In some embodiments, top surface 28A of copper pillar 28 is substantially level with top surface 26A of passivation layer 26. In other embodiments, top surface 28A of copper pillar 28 is lower than top surface 26A, and hence copper pillar 28 is in passivation layer 26, with a thin portion of passivation layer 26 covering copper pillar 28.

Figure 2:
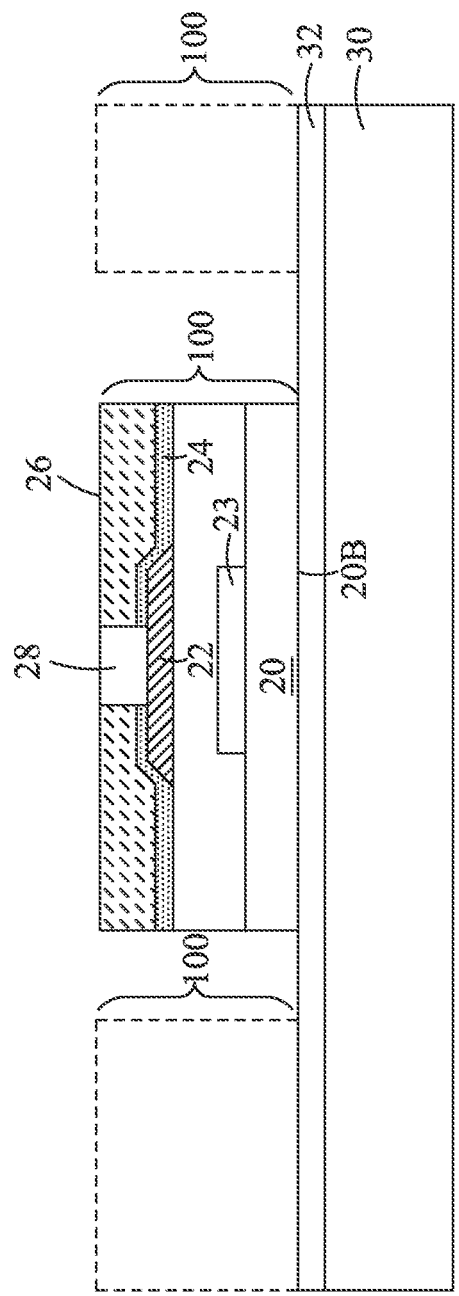

Referring to FIG. 2, adhesive layer 32 is disposed, for example, laminated, on carrier 30. Adhesive layer 32 may be formed of glue. Die 100 is mounted on carrier 30 through adhesive layer 32. Although a single die 100 is illustrated, there may be a plurality of dies 100 identical to each other placed on carrier 30. In the embodiments wherein die 100 includes semiconductor substrate 20, bottom surface 20B of semiconductor substrate 20 contacts adhesive layer 32. Spaces are left between neighboring dies 100.

Figure 3:
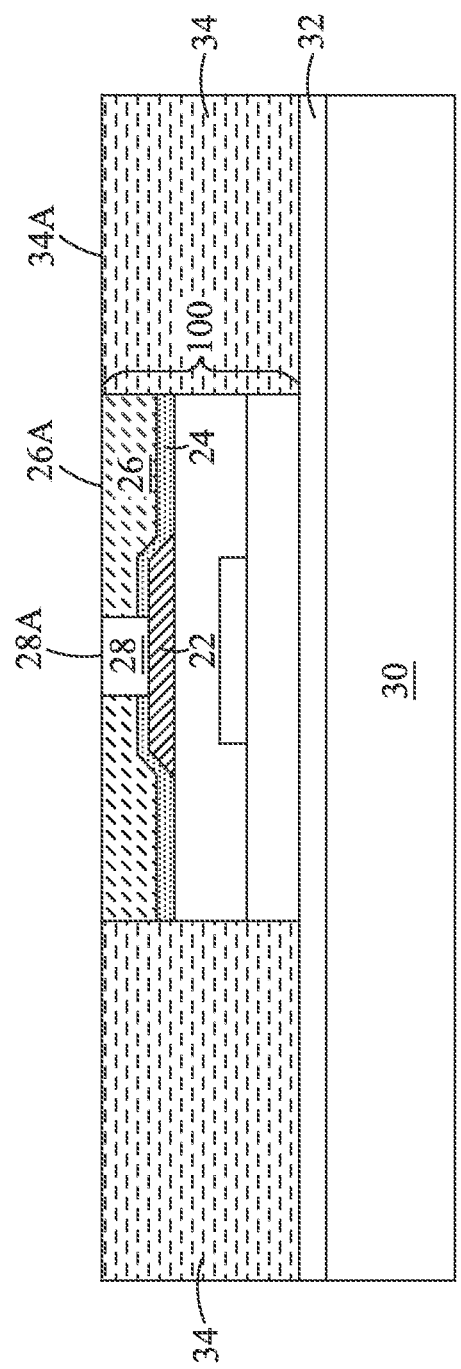

FIG. 3 illustrates the molding of polymer 34 on die 100. Polymer 34 may be a molding compound, and hence is referred to as molding compound 34 hereinafter, although it may also be formed of other materials. Molding compound 34 may comprise an organic material such as an epoxy, which is filled into the spaces between dies 100. The top surface of die 100 may also be covered by molding compound 34. A curing process is then performed to solidify molding compound 34.

As also shown in FIG. 3, a planarization such as a grinding is performed on molding compound 34, until copper pillar 28, and possibly passivation layer 26, are exposed. Accordingly, top surface 26A of passivation layer 26, top surface 28A of copper pillar 28, and top surface 34A of molding compound 34 may be substantially level with each other. In the embodiments wherein copper pillar 28 is embedded in passivation layer 26, a layer of passivation layer 26 is also grinded. As a result of the grinding, there may not be molding compound 34 over die 100. In a top view of the structure in FIG. 3, die 100 is encircled by molding compound 34.

Figure 4:
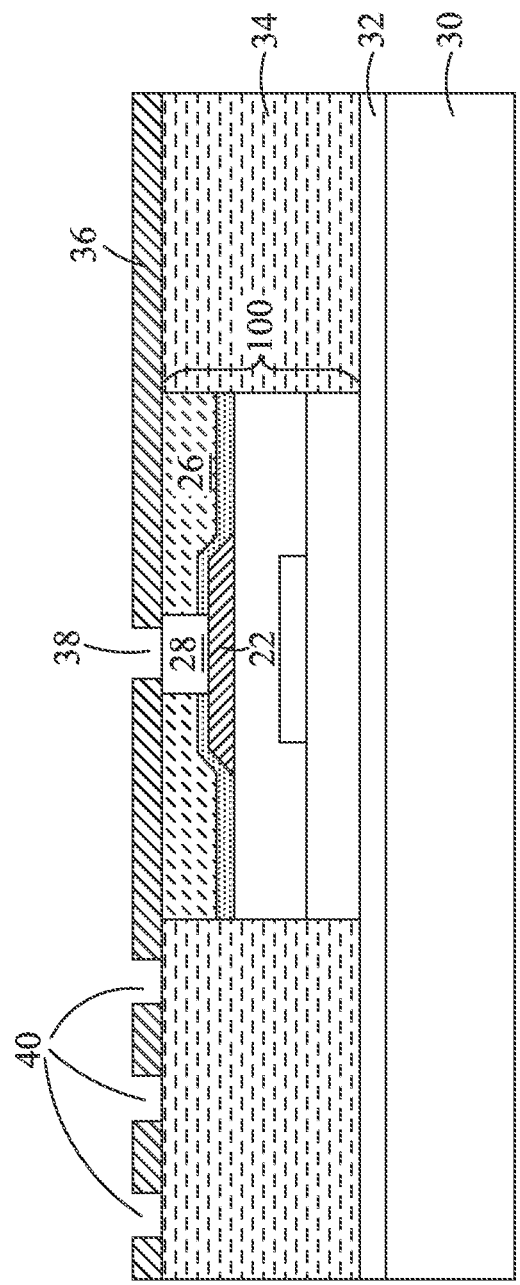

Referring to FIG. 4, dielectric layer 36 is formed over molding compound 34, passivation layer 26, and copper pillar 28. Dielectric layer 36 may be formed using polyimide, PBO, BCB, JSR, for example. Opening 38 is formed in dielectric layer 36, and copper pillar 28 is exposed through opening 38. In some embodiments, openings 40 are formed simultaneously when opening 38 is formed. Openings 40 may be over and aligned to molding compound 34, and/or over and aligned to passivation layer 26.

Figure 5:
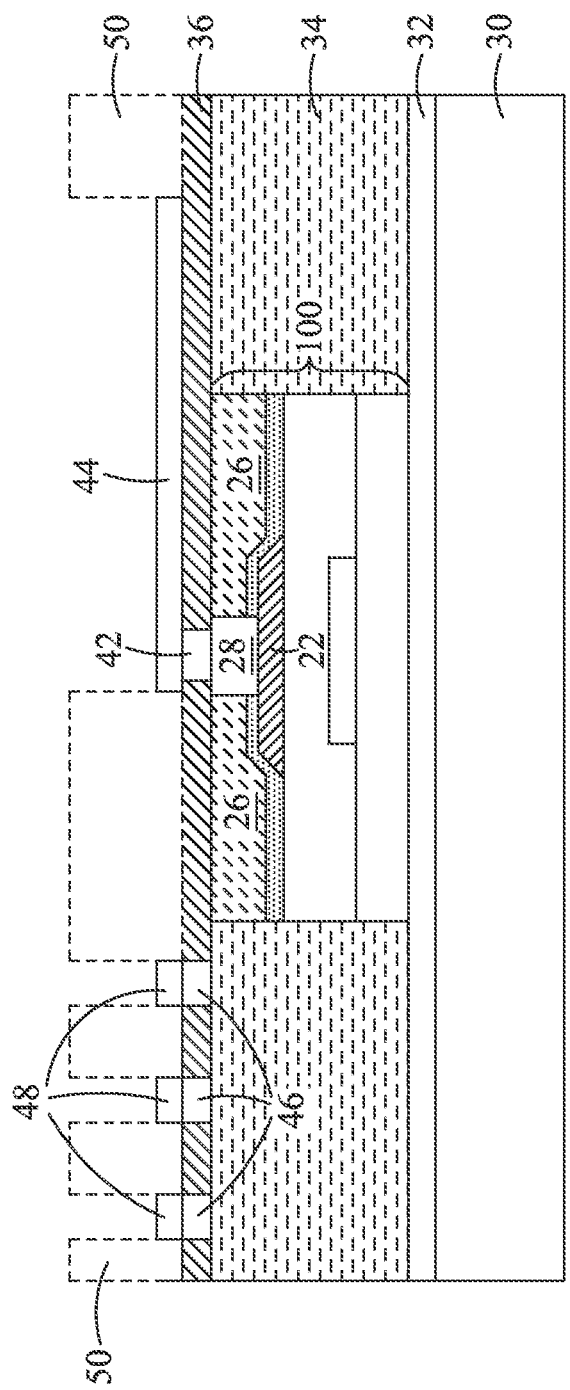

Referring to FIG. 5, a copper Post-Passivation Interconnect (PPI) structure is formed. The copper PPI structure includes via 42 that is formed in opening 38, and PPI line 44 over dielectric layer 36. Via 42 electrically couples copper pillar 28 to PPI line 44. PPI line 44 may extend over and align to molding compound 34 to form a fan-out structure. At the same time via 42 and PPI line 44 are formed, PPI features 46 and features 48 are also formed, wherein PPI features 46 are in dielectric layer 36, and PPI features 48 are over dielectric layer 36. Each of PPI features 46 and 48 may be a metal line or a metal via. In some embodiments, PPI features 46 and 48 have respective edges aligned to each other, so that PPI features 46 and 48 in combination form thick conductive features. In alternative embodiments, edges of PPI features 46 and 48 are misaligned, and hence PPI features 46 and 48 have different top-view shapes and/or top-view sizes. Via 42, PPI line 44, and PPI features 46 and 48 may comprise copper and/or other conductive materials such as aluminum. An exemplary formation process includes forming and patterning photo resist 50, and plating features 42, 44, 46, and 48 in the openings in photo resist 50. Photo resist 50 is then removed.

Figure 6:
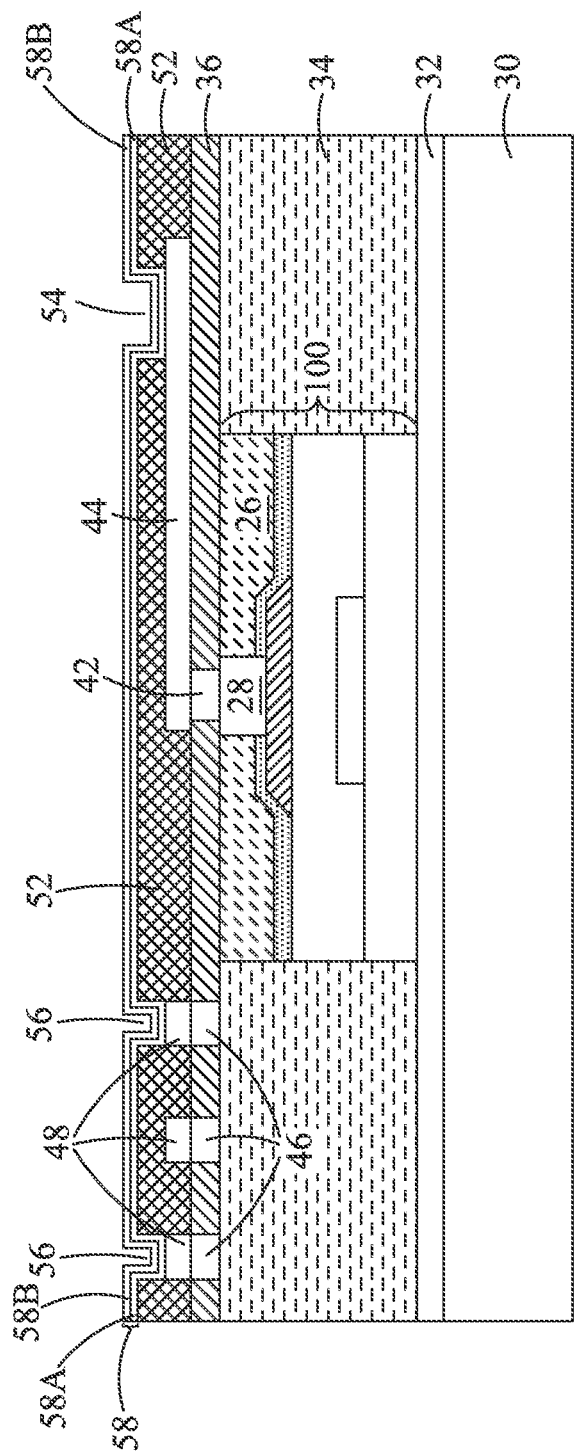

Next, referring to FIG. 6, dielectric layer 52 is formed over dielectric layer 52 and features 42, 44, 46, and 48. Dielectric layer 52 may be formed using similar materials as dielectric layer 36. For example, dielectric layer 52 may include polyimide, PBO, BCB, JSR, or the like. Dielectric layers 36 and 52 may be formed of the same material or different materials. Opening 54 is formed in dielectric layer 52, so that PPI line 44 is exposed. Opening 54 may be over and aligned to molding compound 34 or passivation layer 26. In some embodiments, openings 56 are formed simultaneously when opening 54 is formed. Some of PPI features 48 are exposed through openings 56. Next, Under-Bump Metallurgy (UBM) layer 58 is formed to extend into openings 54 and 56 to contact PPI line 44 and PPI features 48. In some exemplary embodiments, UBM layer 58 comprises titanium layer 58A and copper layer 58B over titanium layer 58A.

Figure 7:
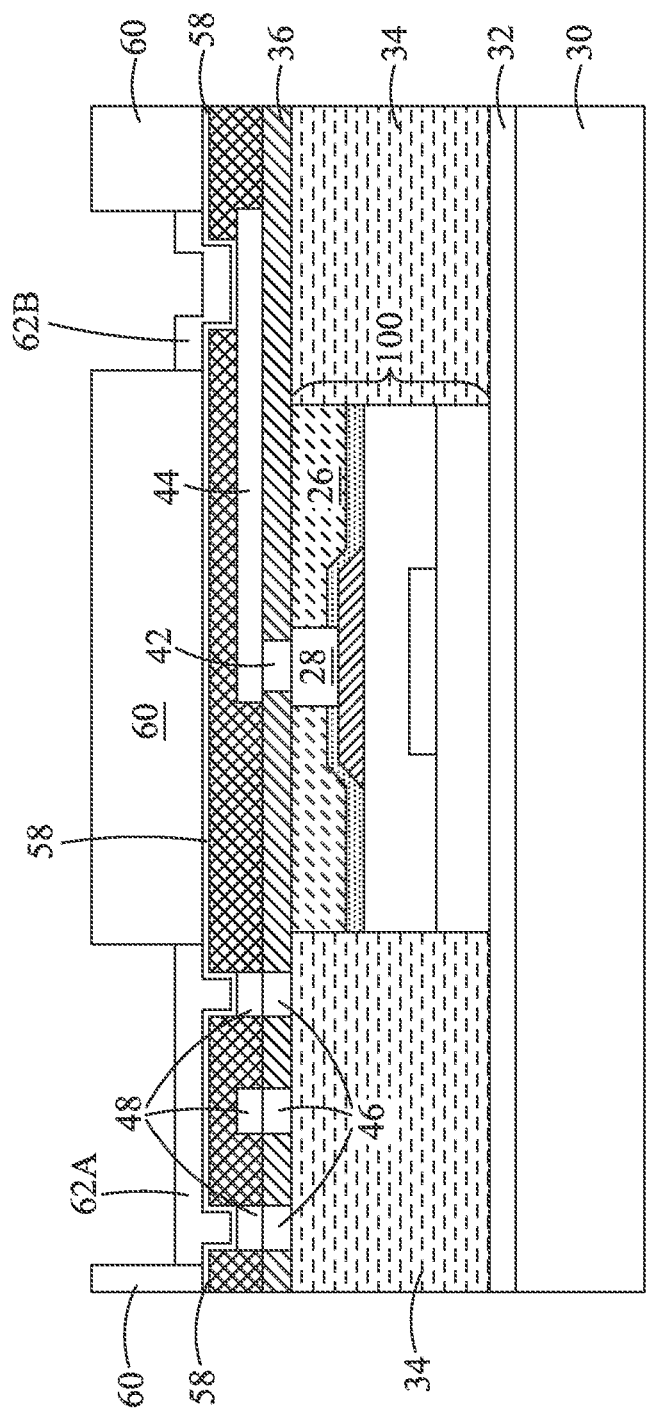

In FIG. 7, photo resist 60 is formed and patterned, so that some portions of UBM layer 58 are exposed, and some other portions are covered. A plating process may be performed to plate a metallic material, which may include copper, nickel, palladium, tin, aluminum, alloys thereof, or combinations thereof, on the exposed portions of UBM layer 58. The plated material includes portions 62A and 62B. Portion 62A is over and connected to PPI features 48. Portion 62B is over and connected to PPI line 44.

Figure 8:
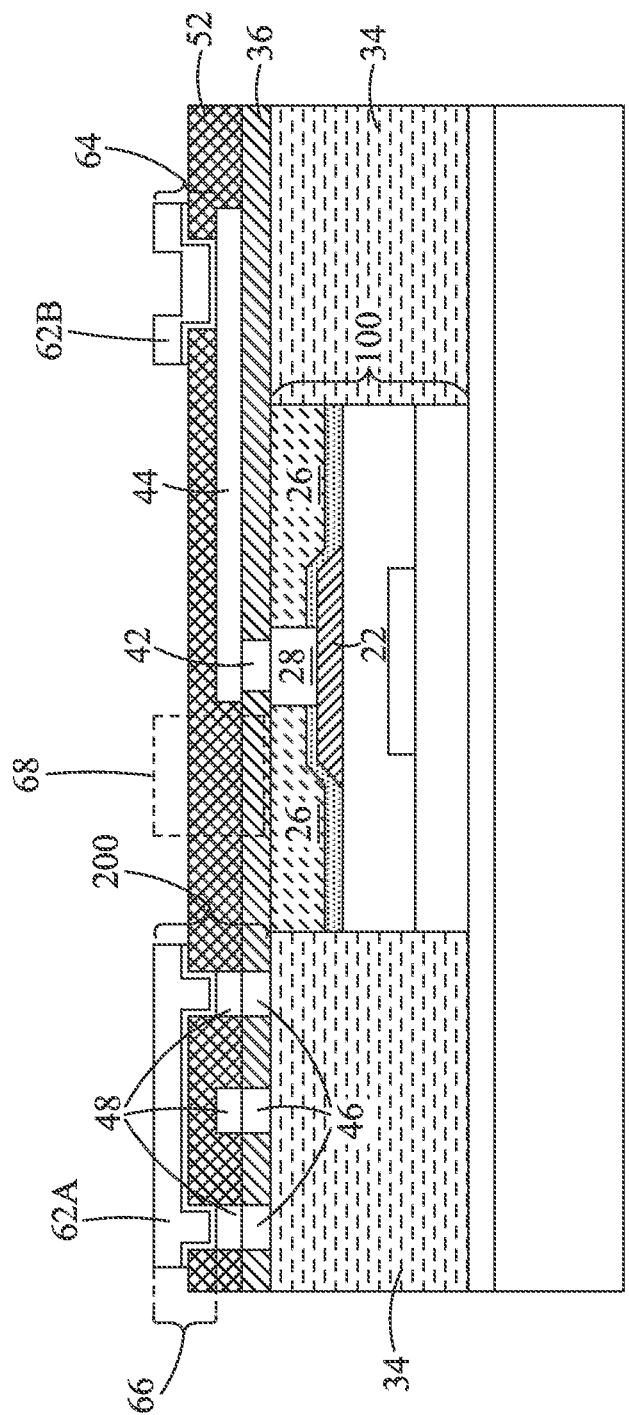

Referring to FIG. 8, photo resist 60 is removed. An etching is performed to remove the portion of UBM layer 58 that are covered by photo resist 60 when the plating is performed. The remaining portions of the UBM layer 58 include a first portion under metallic material portion 62A, and a second portion under metallic material portion 62B. Throughout the description, metallic material portion 62A and the first portion of UBM layer 58 are in combination referred to as UBM Redistribution Line (RDL) 66. Metallic material portion 62B and the second portion of UBM layer 58 are in combination referred to as UBM 64. UBM RDL 66 and the underlying PPI features 46 and 48 form IPD 200, which may be a resistor, a capacitor, an inductor, a transformer, a balun, a micro-stripe, a co-planar waveguide, or the like. IPD 200 may be over and aligned to molding compound 34. Alternatively, IPD 200 may be over and aligned to die 100, wherein dotted rectangle 68 illustrates where the IPD 200 may be formed.

Figure 9:
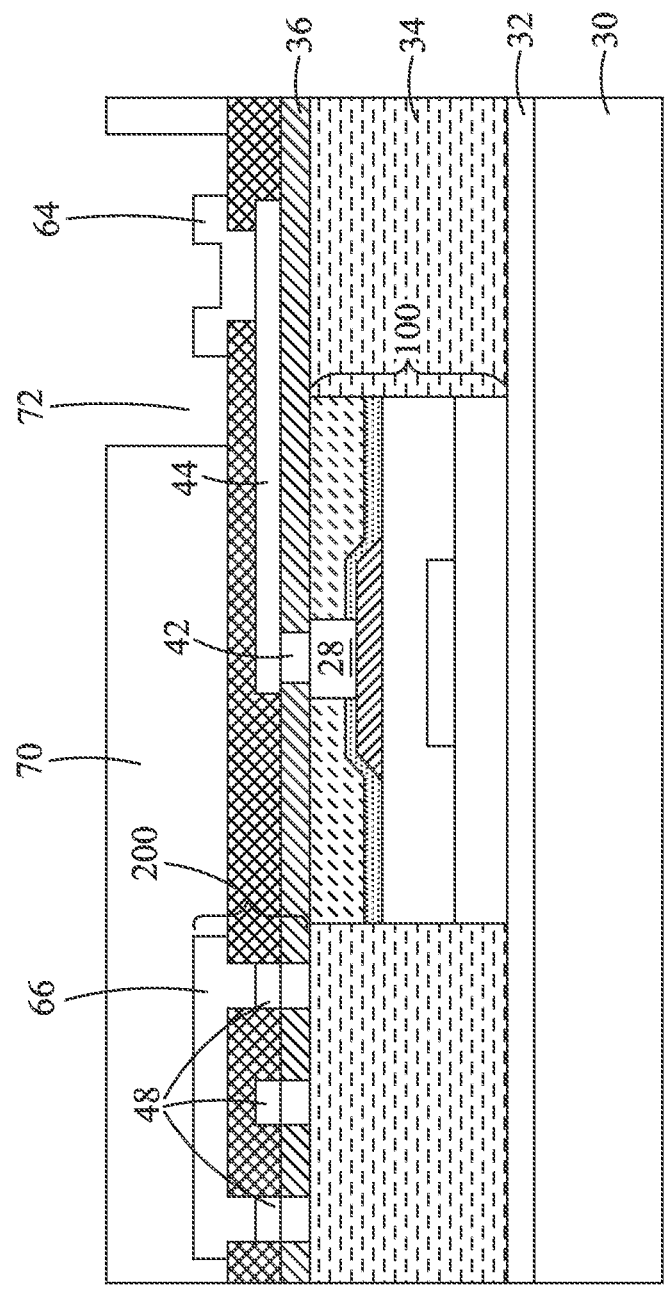
Figure 10:
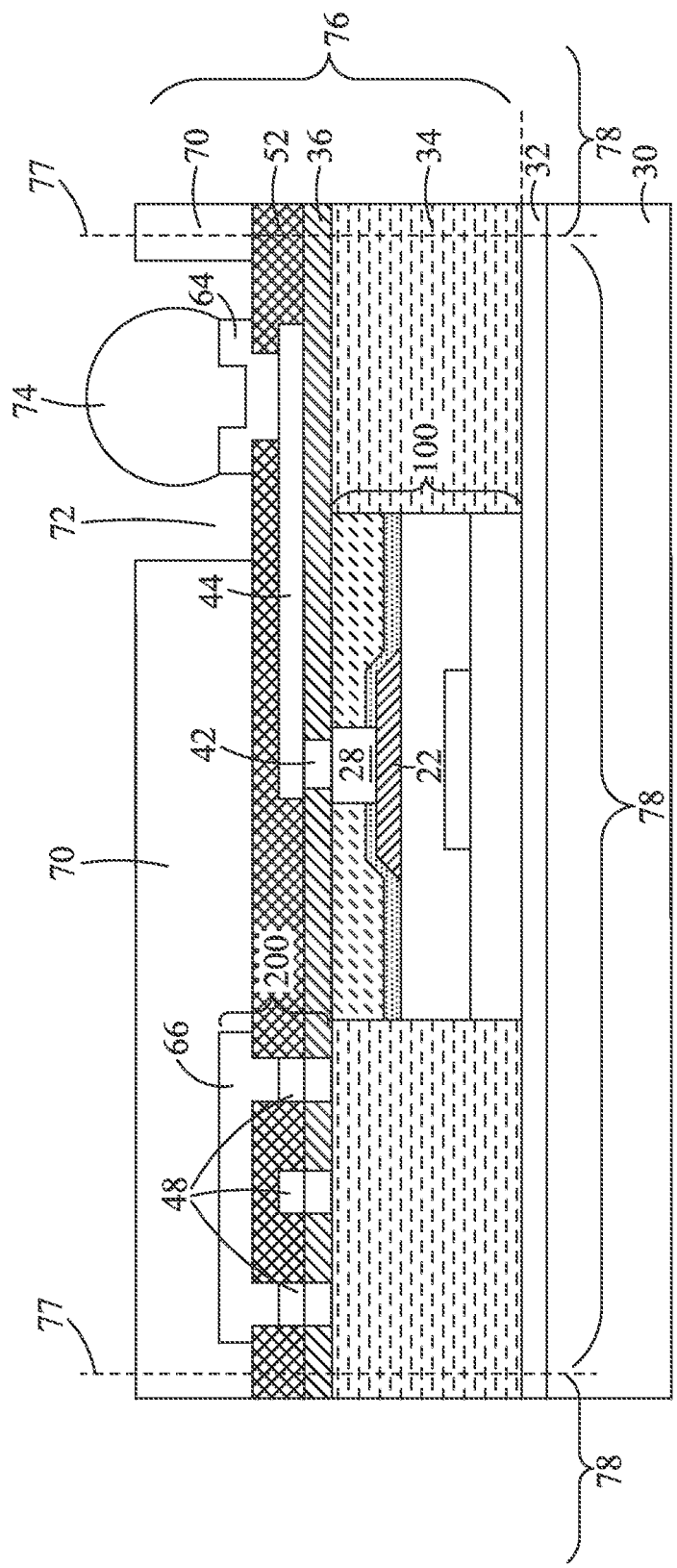
Figure 11:
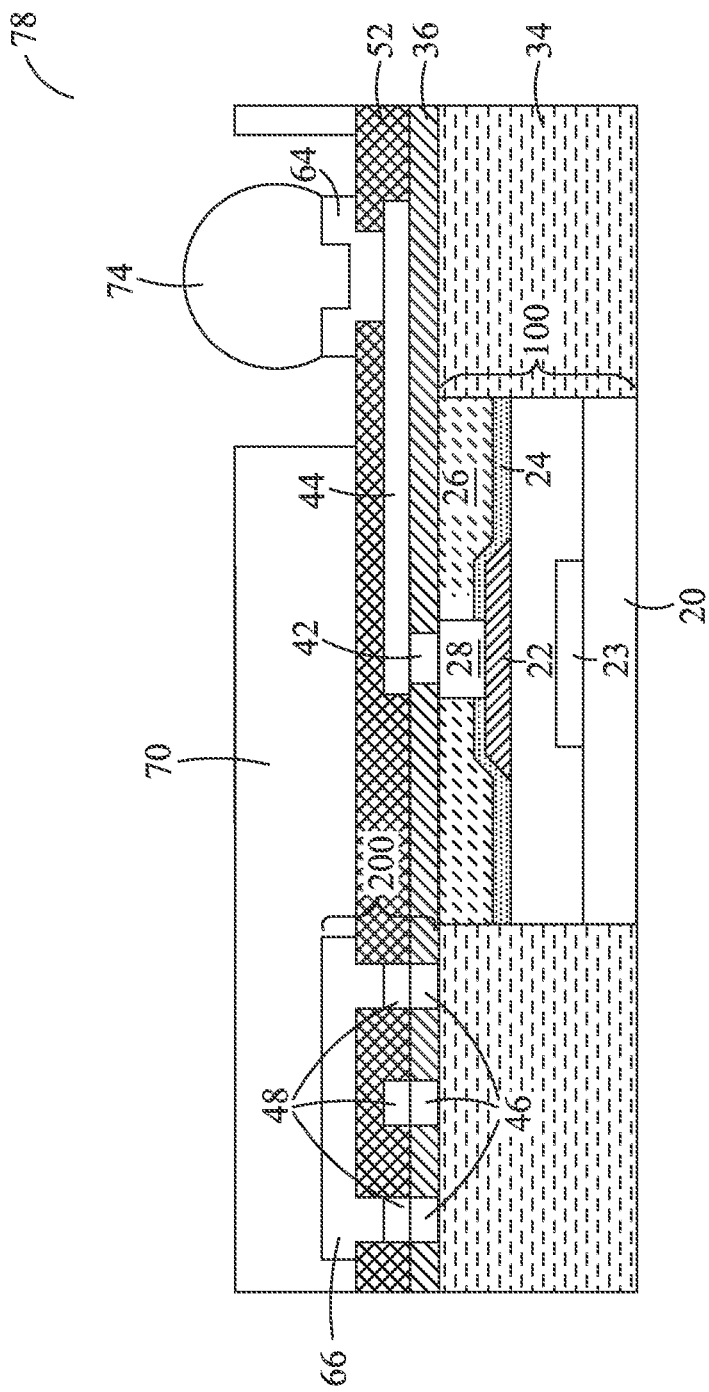

FIG. 9 illustrates the formation of mask layer 70, which is a dielectric layer. In some embodiments, mask layer 70 is formed of a material that can isolate IPD 200 from the detrimental substances (such as moisture) of outside environment. For example, mask layer 70 may be formed of a polyimide, PBO, BCB, or the like. Opening 72 is formed by patterning mask layer 70. UBM 64 is exposed through opening 72. Next, as shown in FIG. 10, solder region 74, which may be a solder ball, is formed on UBM 64. Throughout the description, the structures that are formed on adhesive layer 32 are in combination referred to as wafer 76, which includes a plurality of dies 100 and the corresponding connecting IPD devices 200. In subsequent steps, wafer 76 may be demounted from carrier 30, and adhesive 32 may be stripped from wafer 76. A die saw may be performed along scribe lines 77 to saw wafer 76 into a plurality of packages 78. An exemplary package 78 is shown in FIG. 11.

Figure 12:
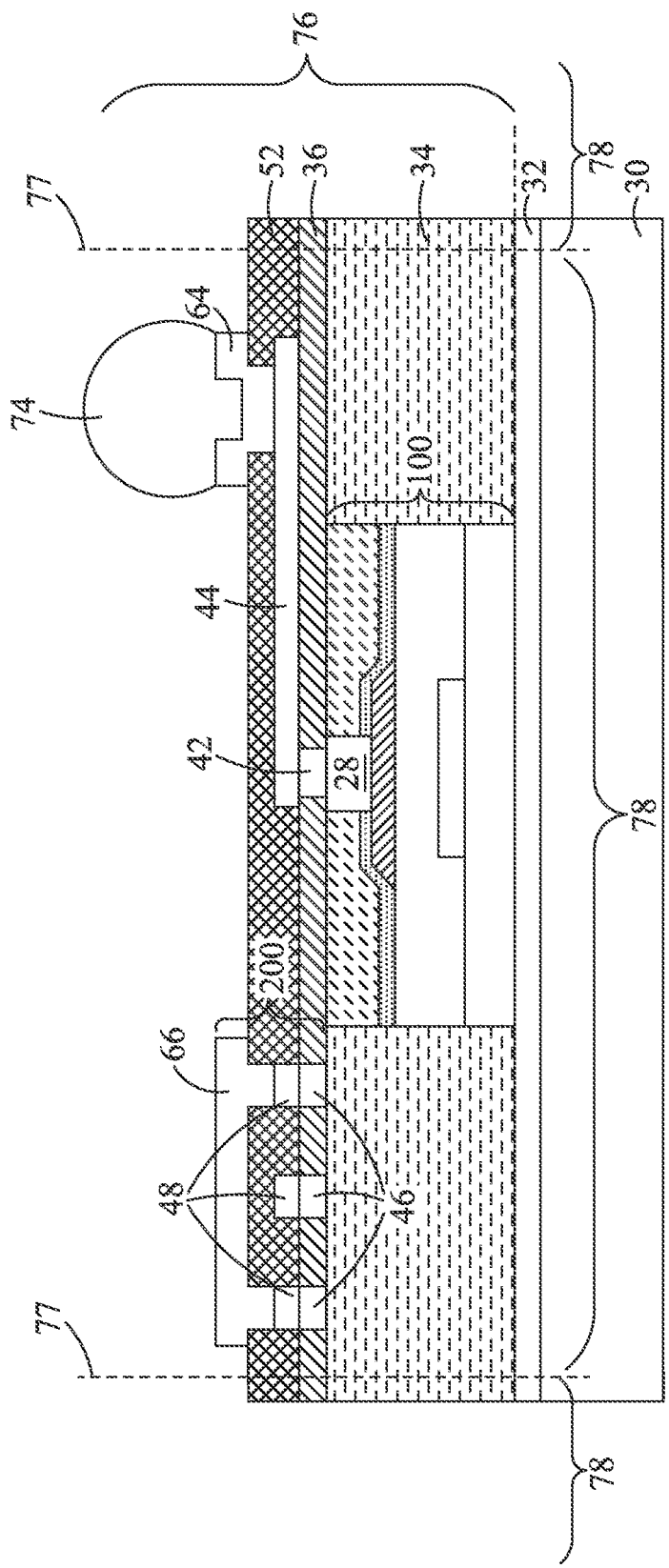
FIGS. 12 through 14 are cross-sectional views of intermediate stages in the manufacturing of a package in accordance with various alternative embodiments.
Figure 13:
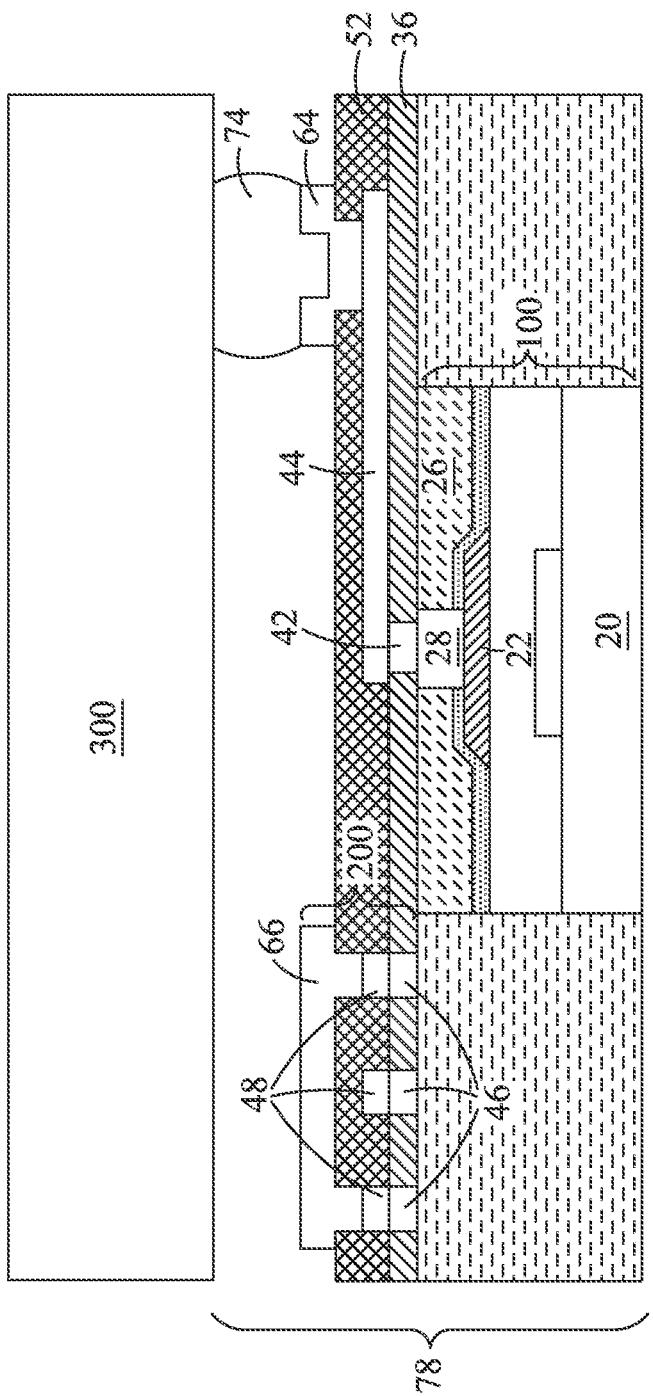
Figure 14:
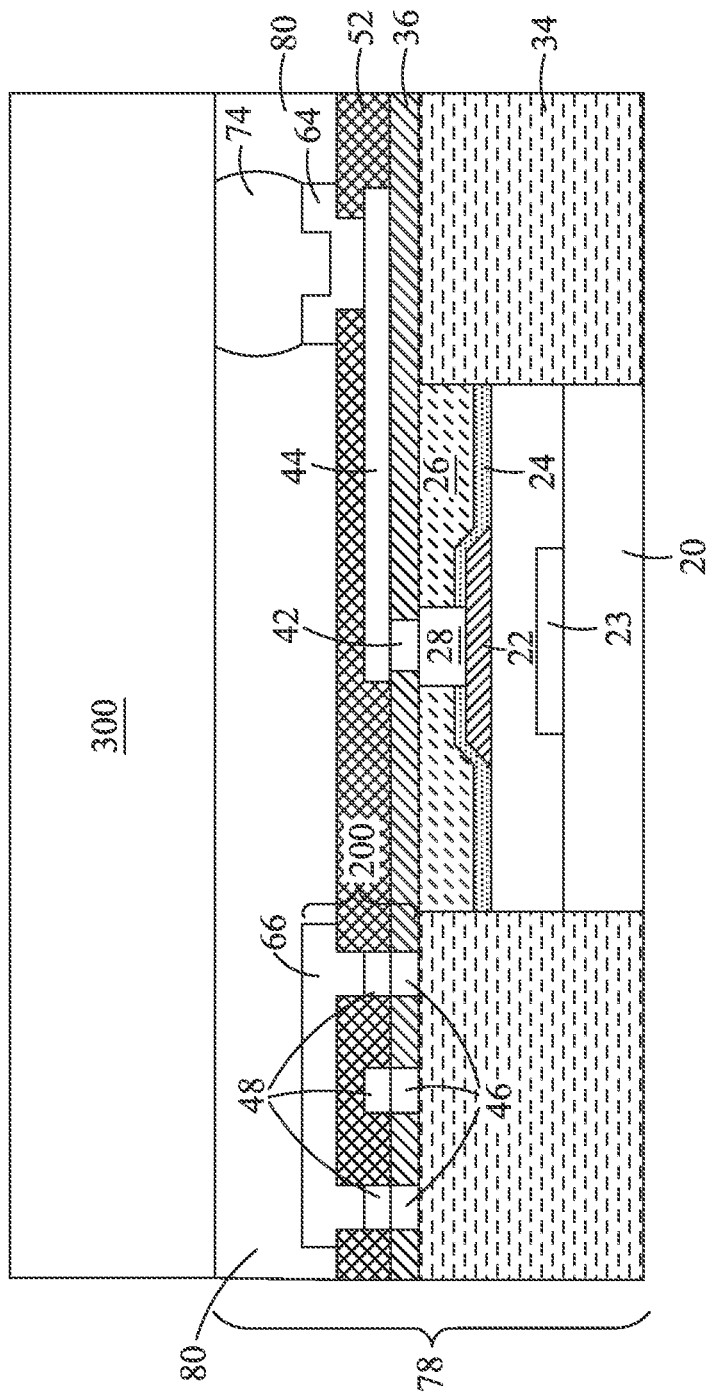

FIGS. 12 through 14 illustrate cross-sectional views of intermediate stages in the formation of a package in accordance with alternative embodiments. Unless specified otherwise, the materials and formation methods of the components in these embodiments are essentially the same as the like components, which are denoted by like reference numerals in the embodiments shown in FIGS. 1 through 11. The details of the like components shown in FIGS. 12 through 14 may thus be found in the discussion of the embodiments shown in FIGS. 1 through 11.

The initial steps of these embodiments are essentially the same as shown in FIGS. 1 through 8. Next, as shown in FIG. 12, without forming a mask layer to cover IPD 200, solder region 74 is formed. Wafer 76, which is the part of the structure over adhesive layer 32, is sawed into a plurality of packages 78. Referring to FIG. 13, one of packages 78 is bonded to package component 300, which may be an interposer, a package substrate, another package, a Printed Circuit Board (PCB), or the like.

Next, as shown in FIG. 14, underfill 80 is dispensed into the gap between package component 300 and package 78, and is then cured. Underfill 80 protects passive device 200 from moisture or other detrimental substances in the external environment.

FIGS. 15A through 19 illustrate some of the exemplary IPDs 200 as in FIGS. 11 and 14. The formation methods of IPDs 200 in FIGS. 15A through 19 may be found by referring to FIGS. 1 through 11. In each of IPDs 200, there may be an upper conductive layer, which is the same layer that is formed simultaneously when UBM RDL 66, a lower conductive layer, PPI line 44, and via 42 are formed.

Figure 15B:
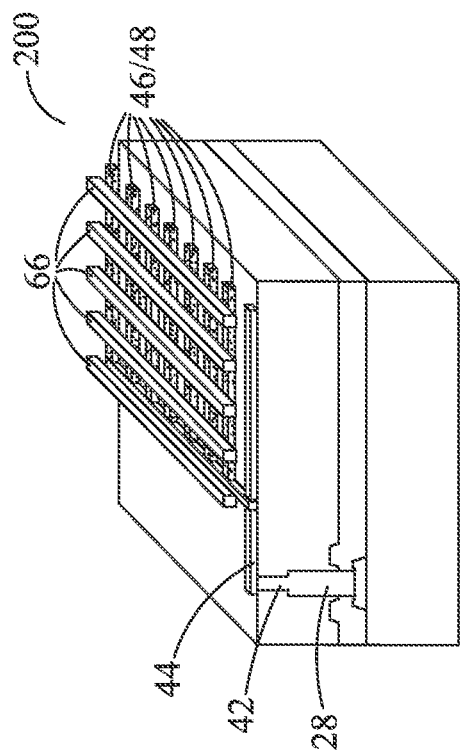
Figure 15A:
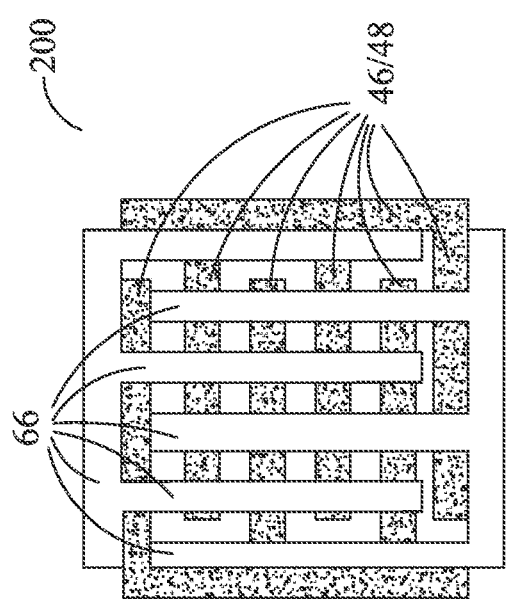

FIG. 15A illustrates a top view of IPD 200, which is a Metal-Oxide-Metal (MOM) capacitor. IPD 200 includes a first plurality of capacitor fingers 66 (the upper layer) interconnected to form one capacitor plate of the capacitor, and capacitor fingers 46/48 (the lower layer) interconnected to form another capacitor plate of the capacitor. FIG. 15B illustrates a perspective view. Fingers 66 and 46/48 may be spaced apart from each other by portions of dielectric layer 52 (not shown in FIGS. 15A and 15B, please refer to FIGS. 11 and 14), which forms parts of the capacitor insulator.

Figure 16B:
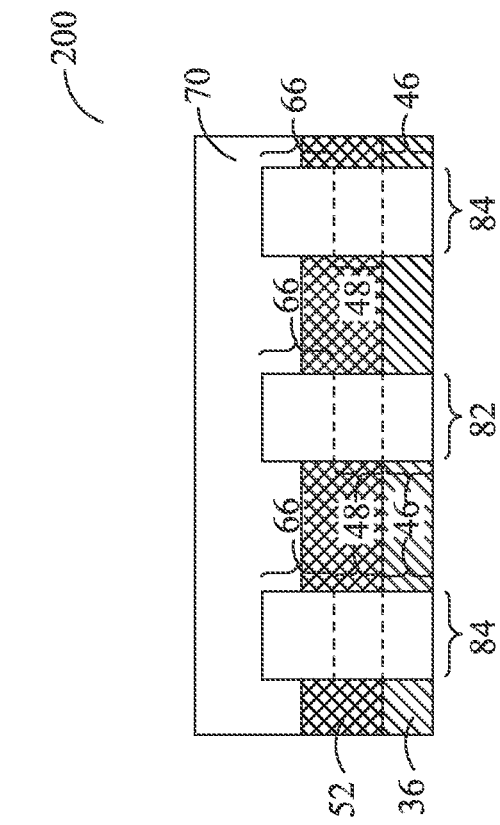
Figure 16A:
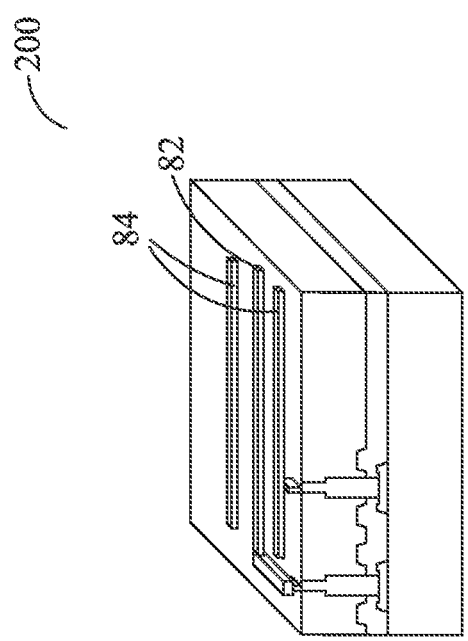

FIGS. 16A and 16B illustrate a perspective view and a cross-sectional view, respectively, of IPD 200, which is a co-planar waveguide that includes signal line 82 and ground lines 84 on the opposite sides of, and parallel to, signal line 82. Referring to FIG. 16B, each of signal line 82 and ground lines 84 may include upper portion 66, and lower portion 46/48, which are stacked to form a thick line. By stacking portions 66 with 46/48, the line resistance of lines 82 and 84 is reduced, and the performance of co-planar waveguide 200 is improved.

Figure 18:
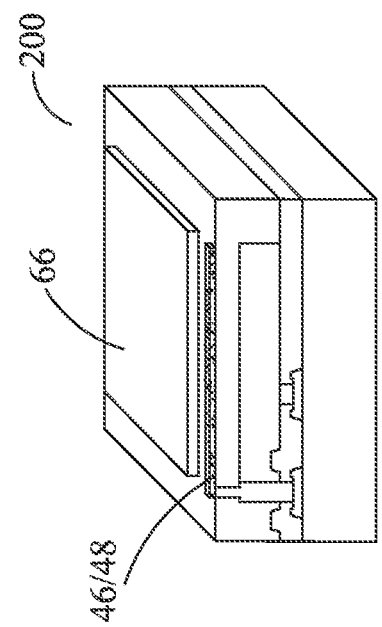
Figure 17:
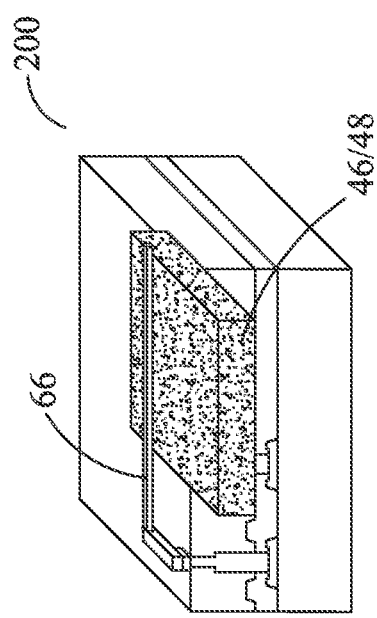

FIG. 17 illustrates a perspective view of IPD 200, which is a micro-strip line that includes PPI features 46/48 acting as a ground plane. UBM RDL 66 acts as the signal line, which is separated from the ground plane 46/48 by an upper portion of dielectric layer 52 (FIGS. 11 and 14). FIG. 18 illustrates a strip line. Opposite to the structure shown in FIG. 17, in this embodiment, the signal line is a part of PPI features 46/48, and the ground line is a part of UBM RDL 66. FIG. 19 illustrates a transformer or a balun 200, wherein the coils in the transformer/balun 200 may comprise stacked features 46/48, and UBM 66 may be used as the connections between the coils.

By using the UBM RDL to form the IPDs, the package areas are used better. The performance of the IPDs is improved. The formation of the IPDs does not require additional masks and lithography steps.

In accordance with embodiments, a device includes a substrate, a metal pad over the substrate, and a passivation layer having a portion over the metal pad. A Post-Passivation Interconnect (PPI) line is disposed over the passivation layer and electrically coupled to the metal pad. An Under-Bump Metallurgy (UBM) is disposed over and electrically coupled to the PPI line. A passive device includes a portion at a same level as the UBM. The portion of the passive device is formed of a same material as the UBM.

In accordance with other embodiments, a device includes a die, which includes a semiconductor substrate, a metal pad over the semiconductor substrate, a passivation layer including a portion over the metal pad, and a metal pillar over the metal pad and extending into the passivation layer. A molding compound encircles the die. A first dielectric layer is over the metal pillar, the passivation layer, and the molding compound. A PPI line is over the first dielectric layer and electrically coupled to the metal pad through the metal pillar and a via in the first dielectric layer. A second dielectric layer has a portion over the PPI line. A UBM is over and electrically coupled to the PPI line, wherein the UBM extends into the second dielectric layer. A solder region is over and connected to the UBM. A passive device includes a first portion in the first dielectric layer, and a second portion over the second dielectric layer.

In accordance with yet other embodiments, a method includes attaching a die over a carrier. The die includes a semiconductor substrate, a metal pad over the semiconductor substrate, a passivation layer having a portion over the metal pad, and a metal pillar over the metal pad and extending into the passivation layer. The die is molded with a polymer, with the polymer encircling the die. The method further includes forming a first dielectric layer over the metal pillar, the passivation layer, and the polymer, and forming first openings in the first dielectric layer. The metal pillar is exposed through one of the first openings. A PPI line is formed over the passivation layer and electrically coupled to the metal pad through the metal pillar and a via in the one of the first openings. A second dielectric layer is formed, and includes a portion over the PPI line. A UBM is formed to be over and electrically coupled to the PPI line. A solder region is formed over and connected to the UBM. At the time the UBM is formed, a portion of a passive device is formed simultaneously.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    molding a die in a polymer, with the polymer encircling the die;
    planarizing the polymer to expose a metal pillar of the die;
    forming a Post-Passivation Interconnect (PPI) line over and electrically coupled to the metal pillar;
    forming an Under-Bump Metallurgy (UBM) over and electrically coupled to the PPI line;
    forming a first portion of a passive device, wherein the first portion of the passive device and the UBM are formed simultaneously; and
    forming a solder ball on the UBM.

2. The method of claim 1 further comprising:
    before the forming the UBM, forming a Post-Passivation Interconnect (PPI) line, with the UBM electrically coupled to the metal pillar through the PPI line; and
    forming a second portion of the passive device, wherein the second portion of the passive device and the PPI line are formed simultaneously.

3. The method of claim 1 further comprising:
    after the planarizing the polymer, forming a dielectric layer overlying and contacting the polymer and the die;
    forming a via in the dielectric layer, wherein the via comprises an electrically conductive material; and
    forming a third portion of the passive device, wherein the third portion of the passive device and the via are formed simultaneously.

4. The method of claim 1, wherein the first portion of the passive device comprises a portion overlapping the polymer.

5. The method of claim 1 further comprising:
    forming a dielectric mask layer over the passive device and the UBM; and
    patterning the dielectric mask layer to expose the solder ball, wherein the passive device is covered by a remaining portion of the dielectric mask layer.

6. The method of claim 1 further comprising:
    bonding the solder ball to a package component; and
    dispensing an underfill into a gap between the die and the package component, wherein the underfill contacts the passive device.

7. The method of claim 1, wherein the solder ball is in direct contact with the UBM.

8. The method of claim 1 further comprising forming a dielectric layer comprising a portion over the PPI line, wherein the UBM comprises a portion over and aligned to the dielectric layer.

9. A method comprising:
attaching a die over a carrier, wherein the die comprises:
a semiconductor substrate;
a metal pad over the semiconductor substrate;
a passivation layer comprising a portion over the metal pad; and
a metal pillar over the metal pad and extending into the passivation layer;
molding the die in a polymer, with the polymer encircling the die;
forming a first dielectric layer over the metal pillar, the passivation layer, and the polymer;
forming first openings in the first dielectric layer, wherein the metal pillar is exposed through one of the first openings;
forming a Post-Passivation Interconnect (PPI) line, wherein the PPI line is electrically coupled to the metal pad through the metal pillar and a via in the one of the first openings;
forming a second dielectric layer comprising a portion over the PPI line;
forming an Under-Bump Metallurgy (UBM) over and electrically coupled to the PPI line;
forming a solder region over and connected to the UBM; and
forming a first portion of a passive device, wherein the first portion of a passive device and the UBM are formed simultaneously.

10. The method of claim 9, wherein the first openings comprise portions over and aligned to the polymer, and wherein at a time the PPI line is formed, a metallic material is filled into portions of the first openings to form a second portion of the passive device.

11. The method of claim 9, wherein the passive device comprises a resistor, a capacitor, an inductor, a transformer, a balun, a micro-stripe, or a co-planar waveguide.

12. The method of claim 9 further comprising:
forming a dielectric mask layer over the passive device and the UBM; and
patterning the dielectric mask layer to expose the solder region, wherein the passive device is covered by a remaining portion of the dielectric mask layer.

13. The method of claim 9 further comprising:
bonding the solder region to a package component; and
dispensing an underfill into a gap between the second dielectric layer and the package component, wherein the underfill contacts the passive device.

14. The method of claim 9 further comprising, before the step of forming the first dielectric layer, performing a grinding step to level a top surface of the metal pillar, the passivation layer, and the polymer.

15. The method of claim 9, wherein the first portion of the passive device comprises a portion overlapping the polymer.

16. The method of claim 9, wherein the passive device comprises a top surface level with a top surface of the UBM, and a bottom surface level with a top surface of the metal pillar.

17. A method comprising:
molding a die with a polymer, with the polymer encircling the die;
planarizing the polymer to expose a metal pillar of the die;
forming a Post-Passivation Interconnect (PPI) line over and electrically coupled to the metal pillar;
forming an Under-Bump Metallurgy (UBM) over and electrically coupled to the PPI line;
forming a first portion of a passive device, wherein a first portion of the passive device and the UBM are formed simultaneously in a same process step, and wherein the first portion of the passive device comprises a portion overlapping the polymer; and
forming a solder ball over and in physical contact with the UBM.

18. The method of claim 17 further comprising:
forming a dielectric layer over the PPI line, with a portion of the UBM over and contacting the dielectric layer; and
forming a second portion of the passive device, wherein the second portion of the passive device and the PPI line are formed simultaneously in a same additional process step.

19. The method of claim 17, wherein the passive device comprises a resistor, a capacitor, an inductor, a transformer, a balun, a micro-stripe, or a co-planar waveguide.

20. The method of claim 17, wherein the passive device comprises a top surface level with a top surface of the UBM, and a bottom surface level with a top surface of the metal pillar.

* * * * *